United States Patent [19]

Inoguchi et al.

[11] Patent Number: 5,206,078
[45] Date of Patent: Apr. 27, 1993

[54] PRINTED CIRCUIT-BOARD AND FABRIC THEREFOR

[75] Inventors: Hirokazu Inoguchi; Shoichi Watanabe; Shin Kasai; Keiichi Kato; Mikiya Fujii, all of Fukushima, Japan

[73] Assignee: Nitto Boseki Co., Ltd., Fukushima, Japan

[21] Appl. No.: 450,864

[22] Filed: Dec. 14, 1989

[30] Foreign Application Priority Data

Dec. 15, 1988 [JP] Japan .................................. 63-316800

[51] Int. Cl.$^5$ .............................................. D03D 3/00
[52] U.S. Cl. ................................ 428/225; 139/420 A; 428/257; 428/288; 428/901
[58] Field of Search ............... 428/228, 268, 273, 417, 428/225, 257, 901, 288, 258, 259; 139/420 R, 420 C, 420 A

[56] References Cited

U.S. PATENT DOCUMENTS

| 4,177,553 | 12/1979 | Klein | 29/625 |
| 4,513,055 | 4/1985 | Leibowitz | 428/245 |
| 4,604,325 | 8/1986 | Pollet et al. | 428/417 |
| 4,833,005 | 5/1989 | Klaar et al. | 428/224 |

Primary Examiner—James J. Bell
Attorney, Agent, or Firm—Darby & Darby

[57] ABSTRACT

A fabric for a printed circuit-board characterized by that it is composed of one or more fiber(s) selected from the group consisting of polyether ether ketone fiber, polyetherimide fiber and polysulphone fiber, and glass fiber, and a printed circuit-board employing the fabric as its base material.

4 Claims, 1 Drawing Sheet

PRINTED CIRCUIT-BOARD AND FABRIC THEREFOR

BACKGROUND OF THE INVENTION

1. Field of the Invention

The present invention relates to a fabric for a substrate of printed circuit-boards used for computers, communication device, etc. and to printed circuit-boards therefrom.

2. Related Art

Generally, glass-epoxy laminates are used as printed circuit-boards; recently performances required for printed circuit-boards are so diversified due to developments in this field that the glass-epoxy laminates cannot satisfy the requirements in some cases. For instance, since a high speed signal propagation is put on with a gain of operating speed, a printed circuit-board of a low dielectric constant which is high reliable even used for a fast operating speed is demanded.

In compliance with this requirement, thermoplastic resins of a low dielectric constant such as polytetrafluoro-ethylene, polysulphone, polyethylene, polybutadiene are examined; and a fabric of polytetrafluoroethylene fiber, aromatic polyamide fiber, quartz fiber, etc. are examined. However, the above-mentioned printed circuit-boards prepared by the prior arts have problems as to processability, reliability as printed circuit-boards and the cost factor. Therefore, they cannot sufficiently meet the requirements yet.

Because a propagation delay of signal and a distortion of digital pulse shape are being noticed as problems with a gain of speed of information processing, printed circuit-boards prepared with materials of low dielectric constant are demanded. However, the development of such base materials for a substrate is delayed; a sufficient means in response to the above demand is not taken. Further, fabrics of D-glass fiber, quartz fiber and polyamide fiber are used on trial as materials for a substrate for a special use. But they are unsatisfactory in both cost and properties.

OBJECT AND SUMMARY OF THE INVENTION

The object of the present invention is to provide at low cost a fabric for a printed circuit-board for a general use having a low dielectric constant required as a board for a high-speed information processing, and a printed circuit-board made therefrom.

The object described above is achieved with a fabric for printed circuit-boards and the printed circuit board employing the fabric as the base material; the present fabric is characterized to be woven with at least one yarn selected from the group consisting of polyether ether ketone (PEEK), polyether imide (PEI) and polysulphone (PSF), and glass fiber yarn.

BRIEF DESCRIPTION OF DRAWINGS

FIG. 1 shows regular basket weave; FIG. 2, does even side twill weave; and FIG. 3 does plain weave.

Figure 1:
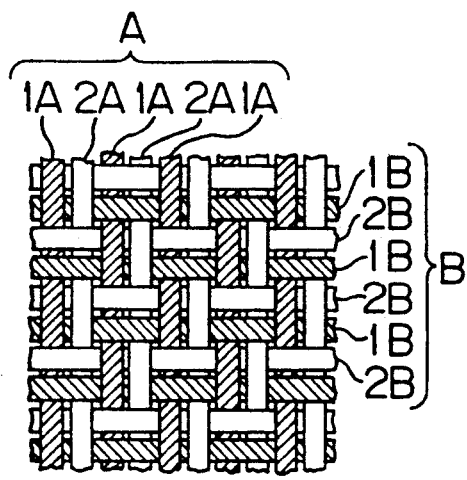
FIGS. 1, 2 and 3 each is a schematic model showing the weave type of the present fabric.
Figure 2:
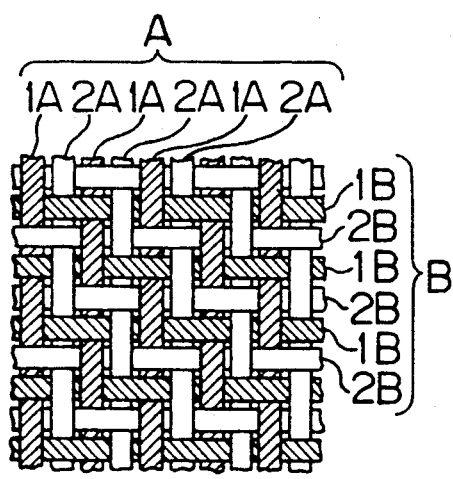
Figure 3:
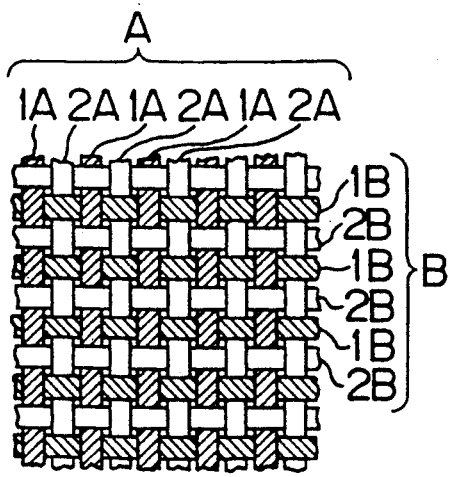

The following signals denote the respective yarns or materials: A: warp, 1A: glass fiber yarn, 2A: a thermoplastic resin fiber yarn, B: weft, 1B: glass fiber yarn, 2B: a thermoplastic resin fiber yarn.

DETAILED DESCRIPTION OF PREFERRED EMBODIMENTS

In the case of the present invention, E-glass fiber, S-glass fiber (glass fiber with a high tensile strength) and D-glass fiber (glass fiber with a low dielectric constant) can be used as a glass fiber for the substrate.

There is no restriction for weaving these resin fibers and glass fibers; any weaving type is possible so long as it is any one of plain basket weave (regular mat weave), even side twill weave and the like.

It is preferred that the glass fiber yarns and the PEEK, PEI or PSF fiber yarns are woven into both the warp and weft uniformly; it is more preferred that these yarns are woven into both the warp and the weft every alternate yarn.

Further, it is also possible that the hybrid yarns are prepared by doubling/twisting and mix spinning the glass fiber yarns and the PEEK, PEI or PSF fiber yarns at a fixed blending ratio; and then the hybrid yarns are used for weaving.

In any case, it is desirable to obtain a uniformly mixed condition of the glass fiber yarn and the PEEK, PEI or PSF fiber yarn as much as possible in order to realize the object of the present invention described above. In case of the doubling/twisting, mix spinning, etc., the desirable blend ratio of the glass fiber yarn is as follows, considering the balance of dielectric constant and strength of the substrate.

① E-glass: 1 to 40 wt %; ② S-glass: 1 to 50 wt %;
③ D-glass: 1 to 65 wt %.

A theoretical dielectric constant (1 MHz) of a fabric can be kept 3.5 or less when the fabric is woven by choosing a blending ratio from the above-mentioned range. Surprisingly a substrate thus prepared has a dielectric constant almost equal to the theoretical value and said dielectric constant hardly increase after the severe treatment test.

Furthermore, it is desirable that a sizing agent requiring no desizing is used in the glass fiber yarn to be employed for the present invention.

Usually, a sizing agent mainly composed of starch and lubricant is used in the glass fiber yarn spinning process; and it is burned out by heating after weaving.

Incidentally, in case of the present invention, a sizing agent requiring no desizing is desirable because a heating cannot be carried out due to mix weaving of the organic fiber yarns and the glass fiber yarns.

A printed circuit-board with high reliability and a low dielectric constant even at faster operting speed can be obtained with the above-mentioned fabric.

There are dielectric materials including polytetrafluoro-ethylene fiber, aromatic polyamide fiber, etc. as shown in Table 1. However, polytetrafluoro-ethylene fiber has no adhesion to matrix resin which is used for the production of the substrate; it cannot be suitable for a substrate of the printed circuit-board to be used under the severe conditions for a long period. Aromatic polyamide fiber is also often used; however, it is not satisfactory in view of its cost and performance, because its dielectric constant of 3.8 is not so low.

TABLE 1

| Materials | Dielectric constant (1 MHz) | Materials | Dielectric constant (1 MHz) |
|---|---|---|---|
| Polytetrafluoro-ethylene | 2.1 | Aromatic polyamide | 3.8 |
| PSF | 3.1 | D-glass | 4.3 |
| PEI | 3.15 | S-glass | 5.5 |
| PEEK | 3.2 | E-glass | 6.9 |

Super-drawing polyethylene (dielectric constant: 2.0), polyethylene terephthalate (PET) (2.7), polyphenylene sulphide (PPS) (3.5), etc. are known as thermoplastic resin fiber with a low dielectric constant. Super-drawing polyethylene is, however, poor in adhesion to matrix resin like polytetrafluoroethylene. PET has a good adhesion to matrix resin; but it has a problem on its heat resistance. And PPS is also poor in adhesion to epoxy resin. This is presumed that a physical entanglement between PPS and matrix resin on the interface is unlikely to occur due to high crystallinity of PPS.

On the contrary, each of PEEK fiber, PEI fiber and PSF fiber has a good adhesion to a matrix resin fiber. Further, PEEK fiber and PEI fiber each possesses another good characteristic that the heat resistance of solder of the laminate made of the fabric which is obtained by mix-weaving a glass fiber and PEEK fiber or PEI fiber, is, contrary to expectations, better than that of a usual laminate made of the fabric of glass fiber only. This is presumed that an physical entanglement between one of the PEEK, PEI or PSF fibers and the matrix resin occurs in microstructure on the interface of the resin fiber, consequently the good adhesion interface is obtained, because none of PEEK, PEI and PSF have high crystallinity unlike PPS. It is unthinkable that these phenomena might occur on the interface between the glass fiber (mineral fiber) and the matrix resin.

As shown in Table-1, PEEK fiber, PEI fiber and PSF fiber each used in the present invention have a dielectric constant of 3.1 to 3.2. In addition, these fibers have a good adhesion to epoxy resin and polyimide resin which are used as the matrix resin. A fabric for a printed circuit-board can be processed, while controlling a theoretical dielectric constant of the fabric 3.5 or lower, by mix-weaving of the glass fiber and PEEK fiber, PEI fiber or PSF fiber, and a printed circuit-board made therefrom can meet the mechanical strength required for the substrate. The printed circuit-board thus obtained is far cheaper and endures enough a high speed processing with a low dielectric constant; and it has a good balance of cost and performance, in comparison with the use of teflon ® or aromatic polyamide fiber yarn.

A calculated dielectric constant of the fabric for the substrate can be controlled 3.5 or lower by respectively controlling volume fractions of the resin fiber and the glass fiber, which are obtained by calculation of Expression (1)

$$1/\epsilon_f V_r \times 1/\epsilon_R + V_g \times 1/\epsilon_g \quad (1)$$

where
$\epsilon_f$: dielectric constant of the fabric
$\epsilon_R$: dielectric constant of the resin fiber
$\epsilon_g$: dielectric constant of the glass fiber
$V_R$: volume fraction of the resin fiber
$V_g$: volume fraction of the glass fiber The values of dielectric constants of E-glass, S-glass and D-glass are shown respectively in Table 1. In the case of mix-weaving the glass fiber with PEEK fiber, PEI fiber or PSF fiber, the upper limit of blending ratio in weight of the glass fiber is 40% or less for E-glass fiber; 50% for S-glass fiber; 65% for D-glass fiber, in order to keep the theoretical dielectric constant of the mix-woven fabric 3.5 or less. At a blending ratio below the upper limit, the glass fiber is properly blended considering a balance of cost according to the use of the printed circuit-board.

When a content of the glass fiber is 1% or less, e.g., even when the fabric consists only of the PEEK fiber, PEI fiber or PSF fiber not including the glass fiber, the fabric can be used for some uses of the printed circuit-board.

In the connection of the method of weaving the fabric to get the uniformity of low dielectric constant of the substrate, a plain weaving is preferred for the use of doubled/twisted yarn or blended yarn of the glass fiber and the PEEK, PEI or PSF fiber; and a uniformly dispersed texture of fabric is preferred for mix-weaving the glass fiber and the PEEK, PEI or PSF fiber, e.g., the basket plain weaving is favorable.

Usually a sizing agent is used for the glass fiber. Considering an affinity and adhesion of the sizing agent to the matrix resin, the sizing without a necessity of desizing is desirable for the glass fiber used in the present invention.

The usual continuous glass fiber for weaving is sized agent with a starch type sizing at the time of fiber forming. This sizing agent reduces an adhesion effect between the matrix resin and the glass fiber and interferes with penetration of the matrix resin between filaments constituting the yarn; in other words, the sizing agent interferes with impregnation of the matrix resin. Therefore, in the past, after a reinforcing cloth was prepared by weaving the continuous glass fiber, the sizing agent was burned out in the over, and then the cloth was impregnated with the resin. However, the continuous glass fiber and the thermoplastic resin fiber yarn are jointly woven in the present invention; therefore, the sizing agent adhering to the continuous glass fiber cannot be removed by burning after weaving. And the use of the continuous glass fiber on which the starch type sizing agent is put causes problems such as a decrease of adhesive strength between the resin and the continuous glass fiber and insufficiency of resin impregnation in some cases. Thus, a sizing agent which increases the adhesion effect between the matrix resin and the continuous glass fiber and enables the resin to be well impregnated, is suitable for the continuous glass fiber to be used in the present invention, e.g., it has the following composition.

(1) Film-forming agent

One or more resin(s) selected from the group consisting of epoxy resin, ethylene oxide-modified epoxy resin, amine-modified epoxy resin, urethane resin and urethane-modified polyester resin, or a mixture thereof is used. Further, vinyl acetate resin, ethylene-vinyl acetate resin, low molecular polyester resin, etc. which are often used for glass roving, are also usable.

(2) Silane coupling agent

One or more compound(s) selected from a group consisting of γ-aminopropyltriethoxysilane, γ-(2-aminoethyl)aminopropyltrimethoxysilane, γ-glycidoxypropyltrimethoxysilane, γ-metacryloxypropyltrimethoxysilane, vinyltri-β-methoxyethoxysilane, hydrochlorinated or dehydrochlorinated product of N-β-(N-vinylbenzylaminoethyl)-γ-aminopropyltrimethoxysilane, γ-chloropropyltrimethoxysilane, γ-mercaptopropyltrimethoxysilane, γ-aminopropylmethyldimethoxysilane and γ-(2-aminoethyl)aminopropylmethyldimethoxysilane, or a mixture thereof.

(3) Cationic surfactant

Quaternary ammonium type or amine type, or a mixture thereof.

(4) Lubricant

One or more compound(s) selected from the group consisting of silicone type, wax type and ester wax type or a mixture thereof.

The sizing containing various components belonging to items (1) to (4) is favorably used in a loading ratio of 0.2 to 1.0 wt %.

In the sizing agent prepared by mixing several components cited above, each of epoxy resin, urethane resin and modified products thereof is compatible with the matrix resin, while silane coupling agent increases adhesion effect between the matrix resin and the surface of the glass fiber. Therefore, the sizing agent laid on the surface of the glass fiber filaments acts as an adhesive between the matrix resin and the glass fiber. Unlike a starch type of sizing agent, the matrix resin can easily penetrate into the glass fiber yarn because the sizing agent is compatible with the matrix resin; i.e., an impregnation is likely to occur. Therefore, a fabric for the printed circuit-board which can satisfy the mechanical strength requirement of it, can be obtained by using the glass fiber in which is given the sizing agent prepared by mixing components cited above.

According to the conventional method, the printed circuit-board relating to the present invention can be processed by using the fabric for the printed circuit-board mentioned above; i.e., a resin-impregnated base material is prepared by impregnating a fabric for the printed circuit-board stated in the present invention with the matrix resin such as epoxy resin. Then the laminate having a low dielectric constant can be obtained by laminating/forming a base material. The matrix resin to be used and a number of resin-impregnated base material pieces are properly decided in compliance with the purpose of use of the laminate.

In addition to epoxy resin, polyester resin, polyimide resin, etc. can be used as a matrix resin. However, epoxy resin is preferable in connection with a material resin to be used for a fabric of the present invention.

EXAMPLE

The present invention is minutely described based on the examples below; however, the present invention will not be limited to these examples at all.

The method of evaluation of the laminates in the examples is as follows.

(i) Dielectric constant

The laminates which were immersed in a boiling water for two hours after prepared and those which were let alone at room temperature for two hours after prepared, were respectively put to the test according to JIS C6481 5.12.

(ii) Insulation resistance

The same samples as mentioned in (i) were put to the test according to JIS C 6481 5.11.

(iii) Percentage of water absorption

The laminates were treated at 133° C. for 75 min. in a pressure cooker after prepared; and the treated laminates were put to the test according to JIS C 6481 5.14. The percentage of water absorption was calculated from a difference between weights before and after the treatment.

(iv) Heat resistance of solder

The test was carried out according to JIS C 6481 5.5: i.e., the laminates were entirely etched to remove copper foil, then treated at 133° C. for 75 min. in a pressure cooker. The laminates thus treated were soldered at 260° C. for 20 seconds. Then the blistering (interlaminar delamination) condition was checked visually.

(v) Bending strength

The laminates were put to the test according to JIS C 6481 5.8.

Example 1

The laminates were prepared by using a fabric for the printed circuit-board, which fabric was woven by using the PEI fiber yarn as the fiber yarn with a low dielectric constant and S-glass fiber yarn as the glass fiber yarn under the following conditions.

The conditions of weaving and those of fabrication of the laminates are as follows.

1) Fabric
  (a) Used yarn: PEI fiber yarn 1215 denier (36 filaments) S-glass fiber yarn TCK 37 1/0 1Z
  (b) Sizing Composition for S-glass fiber yarn:

| | |
|---|---|
| Ethylene oxide-added epoxy resin | 3.0% |
| γ-aminopropyltriethoxysilane | 0.5% |
| Tetraethylenepentaminedistearate | 0.05% |
| Polyethylene emulsion | 0.1% |

(c) Weaving type: Basket plain weave
  (d) Weaving count

| | | |
|---|---|---|
| Warp: | PEI fiber yarn | 19 ends |
| | S-glass fiber yarn | 19 ends |
| Woof: | PEI fiber yarns | 18 ends |
| | S-glass fiber yarn | 18 ends |

2) Matrix resin: G-10 composition (epoxy resin)
3) Forming of laminate
  Temperature: 170° C.
  Pressure: 50 kg/cm², 90 min.

Example 2

The laminates were obtained under the same operation as of Example 1, except a use of the PEEK fiber yarn as the resin fiber yarn with a low dielectric constant.

Comparative example

The fabric for the printed circuit-board was woven by using the E-glass fiber yarn only; then the laminates were prepared by using the fabric and provided to the test.

1) Fabric
  (a) Used yarn: ECG37 1/0 1Z both for warp and weft

-continued (b) Sizing agent for E-glass fiber yarn: Starch type
(c) Weaving type: Plain weaved
(d) Weaving count (number of yarn/25 mm)
    Warp: 19, Weft: 18
(e) Subjected to epoxysilane treatment (Z6040) after usual heating treatment
2) Matrix resin: G-10, composition (epoxy resin)
3) Forming of laminate:
   Temperature: 170° C.
   Pressure: 50 kg/cm$^2$, 90 min.

The laminates obtained in Examples 1 and 2 and Comparative example were put to the test according to the method of evaluation mentioned above. The obtained results were shown in Table 2.

TABLE 2

|  | Example 1 | Example 2 | Comparative example |
|---|---|---|---|
| Dielectric const. A*$^1$ | 3.56 | 3.51 | 4.54 |
| (1 MHz) D-2/100*$^2$ | 3.72 | 3.75 | 4.80 |
| Insulation resistance A*$^1$ | $5.0 \times 10^{14}$ | $2.0 \times 10^{14}$ | $4.3 \times 10^{14}$ |
| Ω D-2/100*$^2$ | $1.5 \times 10^{12}$ | $8.2 \times 10^{11}$ | $1.0 \times 10^{12}$ |
| Percentage of water absorption % (PCT 133° C. 75 min.) | 0.98 | 1.02 | 1.08 |
| Blistering (PCT 133° C. 75 min. 260° C. 20 sec) | Unoccurred | Unoccurred | Occurred |
| Bending strength kg/mm$^2$ | 38.9 | 37.4 | 54.6 |
| Number of lamination Ply | 4 | 4 | 8*$^3$ |
| Thickness of laminate mm | 1.47 | 1.45 | 1.48 |

Note:
*$^1$Value obtained by measuring the sample kept in an ordinary state after prepared
*$^2$Value obtained by measuring the sample immersed in a boiling water for two hours after prepared
*$^3$8-plylamination was made to adjust a thickness of the laminate.

As shown in Table 2, the laminates prepared in Example 1 and 2 have dielectric constants meeting dielectric characteristic which are required by the printed circuit-board industry today; and they also have other electric characteristic, heat resistance, etc. equal to or better than those of the laminate prepared in Comparative example.

Although the bending strength of the laminate in Examples is poorer than that of Comparative example, a level of bending strength not less than that of Examples raises no problem in an ordinary use.

As described above, the fabric for the printed circuit-board prepared according to the present invention permits to offer the printed circuit-board which can keep the balance of dielectric and other characteristics and its cost. And further the printed circuit-board which has dielectric characteristic in compliance with the use, can be obtained by changing a blending ratio of the glass fiber.

Because the fabric of the present invention needs processes of neither heating nor surface treatment which are necessary for an usual fabric for the printed circuit-board, there is a merit that a process for a production of the fabric is simplified.

We claim:

1. A fabric for a printed circuit-board which comprises a joint weave of glass fiber and at least one fiber selected from the group consisting of polyether ether ketone fiber, polyetherimide fiber and polysulphone fiber.

2. A fabric for a printed circuit-board according to claim 1, wherein the glass fiber is any one of E-glass fiber, S-glass fiber and D-glass fiber.

3. A fabric for a printed circuit-board according to claim 1, wherein for the glass fiber is treated with a sizing agent prepared by mixing essential components and other lubricating components, of which the essential components consist of a film-forming agent which is composed of at least one resin selected from the group consisting of epoxy resin, amine-modified epoxy resin, ethylene oxide-modified epoxy resin, urethane resin and urethane-modified polyester resin and a mixture thereof, silane coupling agent and cationic surfactant.

4. A fabric as in claim 1, wherein said weave has a theoretical dielectric constant of approximately 3.5 or lower.

* * * * *